US012132152B2

(12) United States Patent
Tang et al.

(10) Patent No.: US 12,132,152 B2
(45) Date of Patent: Oct. 29, 2024

(54) LIGHT-EMITTING DIODE

(71) Applicant: QUANZHOU SANAN SEMICONDUCTOR TECHNOLOGY CO., LTD., Fujian (CN)

(72) Inventors: Hongbin Tang, Fujian (CN); Yu-Tsai Teng, Fujian (CN); Yaowei Chuang, Fujian (CN); Ji-pu Wu, Fujian (CN); Chiawen Wu, Fujian (CN); Wen-Chia Huang, Fujian (CN); Chung-Ying Chang, Fujian (CN)

(73) Assignee: QUANZHOU SANAN SEMICONDUCTOR TECHNOLOGY CO., LTD., Fujian (CN)

( * ) Notice: Subject to any disclaimer, the term of this patent is extended or adjusted under 35 U.S.C. 154(b) by 461 days.

(21) Appl. No.: 17/588,123

(22) Filed: Jan. 28, 2022

(65) Prior Publication Data

US 2022/0158040 A1  May 19, 2022

Related U.S. Application Data

(63) Continuation-in-part of application No. PCT/CN2020/096173, filed on Jun. 15, 2020.

(51) Int. Cl.
*H01L 33/46* (2010.01)
*H01L 33/00* (2010.01)
(Continued)

(52) U.S. Cl.
CPC ..................... *H01L 33/46* (2013.01)

(58) Field of Classification Search
CPC ......... H01L 33/08; H01L 33/10; H01L 33/22; H01L 33/46; H01L 33/60
See application file for complete search history.

(56) References Cited

U.S. PATENT DOCUMENTS

2011/0103420 A1*  5/2011  Koda ................... H01S 5/18308
                                                              372/45.01
2011/0127549 A1*  6/2011  Lee .......................... H01L 33/06
                                                              257/E33.074
(Continued)

FOREIGN PATENT DOCUMENTS

CN          109449260 A       3/2019

OTHER PUBLICATIONS

Search Report appended to an Office Action, which was issued to Chinese counterpart application No. 202080006180.8 by the CNIPA on Jun. 1, 2023, with an English translation thereof.

*Primary Examiner* — Mohsen Ahmadi
(74) *Attorney, Agent, or Firm* — DLA PIPER LLP (US); Blake Jackson

(57) ABSTRACT

A light-emitting diode includes a semiconductor light-emitting stack and a distributed Bragg reflector (DBR) structure. The semiconductor light-emitting stack has a first surface and a second surface opposite to each other. The DBR structure is disposed on one of the first surface and the second surface of the semiconductor light-emitting stack, and includes at least one set of first light-transmitting layers and at least one set of second light-transmitting layers stacked on each other in the first direction. The first light-transmitting layers has interface roughness greater than that of the second light-transmitting layers.

20 Claims, 8 Drawing Sheets

(51) Int. Cl.
    *H01L 33/10*     (2010.01)
    *H01L 33/22*     (2010.01)
    *H01L 33/38*     (2010.01)

(56)     References Cited

U.S. PATENT DOCUMENTS

| | | | |
|---|---|---|---|
| 2015/0144980 A1* | 5/2015 | Tsai | H01L 33/42 257/98 |
| 2015/0162501 A1* | 6/2015 | Hsieh | H01L 33/405 257/98 |
| 2017/0098735 A1* | 4/2017 | Huang | H01L 33/0095 |
| 2017/0256678 A1* | 9/2017 | Liao | H01L 33/30 |
| 2017/0263820 A1* | 9/2017 | Lu | H01L 25/0753 |
| 2018/0166856 A1* | 6/2018 | Takeuchi | H01S 5/32341 |
| 2018/0277590 A1* | 9/2018 | Chung | H01L 27/153 |
| 2018/0337304 A1* | 11/2018 | Fu | H01L 33/20 |
| 2018/0374985 A1* | 12/2018 | Chen | H01L 33/007 |

* cited by examiner

LIGHT-EMITTING DIODE

CROSS-REFERENCE TO RELATED APPLICATION

This application is a bypass continuation-in-part application of PCT International Application No. PCT/CN2020/096173 filed on Jun. 15, 2020. The entire content of the international patent application is incorporated herein by reference.

FIELD

The disclosure relates to a semiconductor optoelectronic device, and more particularly to a light-emitting diode.

BACKGROUND

A light-emitting diode (LED) is regarded as one of the most promising light sources due to various advantages, such as high brightness, high luminous efficiency, small dimension, and long service life. Recently, the LED has been widely applied in various fields, e.g., lighting, signal display, backlight, vehicle lamp, and large screen display. Since the LED has wide applications, there is a need to improve the brightness and the luminous efficiency of the LED.

Currently, the luminous efficiency of an LED device is mainly determined by two factors, i.e., internal quantum efficiency and external quantum efficiency. The internal quantum efficiency is defined as an efficiency of converting an injected electrical energy into a light energy. The internal quantum efficiency of a conventional LED chip ranges from 70% to 80%. The internal quantum efficiency of an LED chip having a good semiconductor epitaxial structure can be 90%. The external quantum efficiency is defined as an efficiency of extracting a light energy from an LED chip. Since the external quantum efficiency of the conventional LED chip merely ranges from 40% to 50%, there is still a need to improve the external quantum efficiency. The technique used for improving the luminous efficiency of the LED is widely studied, and mainly includes surface (or interface) roughening, introduction of a distributed Bragg reflector (DBR) structure or a light-transmissive substrate, substrate stripping, chip flipping, and chip shaping.

In the field of optical coating, the DBR structure might include plural sets of at least two semiconductor material layers or dielectric material layers which are alternately stacked, to thereby exhibit a high reflectivity within a certain optical wavelength range. According to Snell's law, when an incident light is transmitted from one medium having a high refractive index to another medium having a low refractive index, total reflection might occur if an incident angle of the incident light is greater than a critical angle of the incident light. Referring to FIG. 1, a conventional LED includes a semiconductor substrate 901, a semiconductor light-emitting stack, a DBR structure 908, a transparent conducting layer 905, a first electrode 906, and a second electrode 907. The semiconductor light-emitting stack and the DBR structure 908 are disposed at two opposite sides of the semiconductor substrate 901. The semiconductor light-emitting stack includes a first conductivity type semiconductor layer 902, a light-emitting layer 903, and a second conductivity type semiconductor layer 904. The first conductivity type semiconductor layer 902 is disposed on the semiconductor substrate 901. The light-emitting layer 903 is disposed on the first conductivity type semiconductor layer 902 opposite to the semiconductor substrate 901. The second conductivity type semiconductor layer 904 is disposed on the light-emitting layer 903 opposite to the first conductivity type semiconductor layer 902. The transparent conducting layer 905 is disposed on the second conductivity type semiconductor layer 904 opposite to the light-emitting layer 903. The first electrode 906 is disposed on a portion of a surface of the first conductivity type semiconductor layer 902 exposed from the light-emitting layer 903, the second conductivity type semiconductor layer 904, and the transparent conducting layer 905. The second electrode 907 is disposed on the transparent conducting layer 905 opposite to the second conductivity type semiconductor layer 904. The DBR structure 908 is disposed on the semiconductor substrate 901 opposite to the semiconductor light-emitting stack, and is formed with a multi-layered structure. Interfaces between different layers of the DBR structure 908 are smooth. In this example, a light emitted from the light-emitting layer 903 and transmitted to the DBR structure 908 might undergo total reflection when an incident angle of the light is greater than a critical angle of the light. When a portion of the light undergoing a first time of total reflection is transmitted from one medium having a high refractive index to another medium having a low refractive index, such light might undergo two or more times of total reflection, causing some of the light to be absorbed and attenuated. Therefore, the reflection efficiency of the DBR structure 908 might be adversely affected.

SUMMARY

An object of the disclosure is to provide a light-emitting diode which can alleviate or overcome the aforesaid shortcomings of the prior art.

According to a first aspect of the disclosure, a light-emitting diode includes a semiconductor light-emitting stack and a distributed Bragg reflector (DBR) structure.

The semiconductor light-emitting stack has a first surface and a second surface opposite to each other. The semiconductor light-emitting stack includes, in sequence in a first direction from the first surface to the second surface, a first conductivity type semiconductor layer, a light-emitting layer, and a second conductivity type semiconductor layer.

The DBR structure is disposed on one of the first surface and the second surface of the semiconductor light-emitting stack, and includes at least one set of first light-transmitting layers and at least one set of second light-transmitting layers stacked on each other in the first direction. The first light-transmitting layers have interface roughness greater than that of the second light-transmitting layers. At least two of the first light-transmitting layers have different refractive indices. At least two of the second light-transmitting layers have different refractive indices According to a second aspect of the disclosure, a light-emitting diode includes a semiconductor substrate, a semiconductor light-emitting stack, and a DBR structure.

The semiconductor substrate has a first surface and a second surface opposite to each other.

The semiconductor light-emitting stack includes a first conductivity type semiconductor layer, a light-emitting layer, and a second conductivity type semiconductor layer stacked in sequence on the first surface.

The DBR structure is disposed on the second surface opposite to the semiconductor light-emitting stack. The DBR structure includes at least one set of first light-transmitting layers and at least one set of second light-transmitting layers stacked on each other. At least two of the first light-transmitting layers have different refractive indices. At least two of the second light-transmitting layers have different refractive indices. The interface roughness of the first light-transmitting layers is one to three times the roughness of the second surface of the semiconductor substrate.

According to a third aspect of the disclosure, a light-emitting diode includes a semiconductor light-emitting stack and a DBR structure.

The semiconductor light-emitting stack has a first surface and a second surface opposite to each other. The semiconductor light-emitting stack includes, in sequence in a first direction from the first surface to the second surface, a first conductivity type semiconductor layer, a light-emitting layer, and a second conductivity type semiconductor layer.

The DBR structure is disposed on one of the first surface and the second surface of the semiconductor light-emitting stack, and includes at least one set of first light-transmitting layers and at least one set of second light-transmitting layers stacked on each other in the first direction. The first light-transmitting layers have interface roughness ranging from 1.0 nm to 20.0 nm. The first light-transmitting layers in each set of the first light-transmitting layers and the second light-transmitting layers in each set of the second light-transmitting layers have refractive indices that increase in a second direction away from the semiconductor light-emitting stack.

Another object of the disclosure is to provide a light-emitting packaging structure which can alleviate or overcome the aforesaid shortcomings of the prior art.

The light-emitting packaging structure includes a mounting substrate and the above-mentioned light-emitting diode disposed on the mounting substrate.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
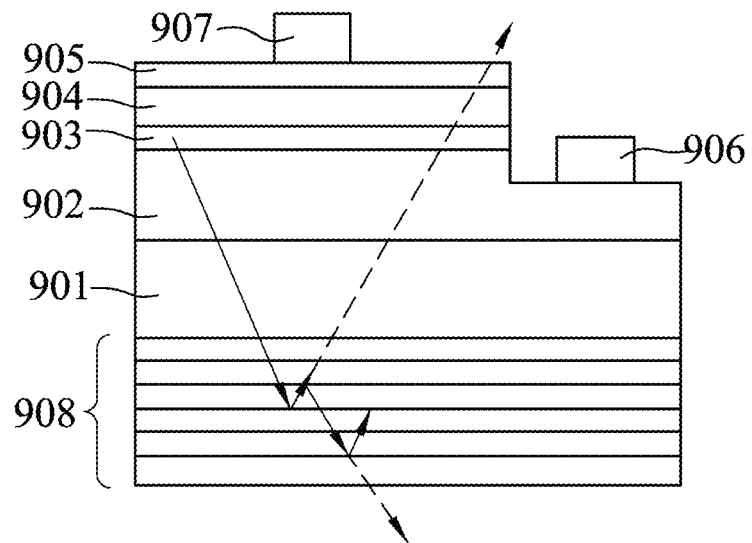
FIG. 1 is a schematic view illustrating total reflection of light in a conventional light-emitting diode.

Before the disclosure is described in greater detail, it should be noted that where considered appropriate, reference numerals have been repeated among the figures to indicate corresponding or analogous elements, which may optionally have similar characteristics.

Figure 2:
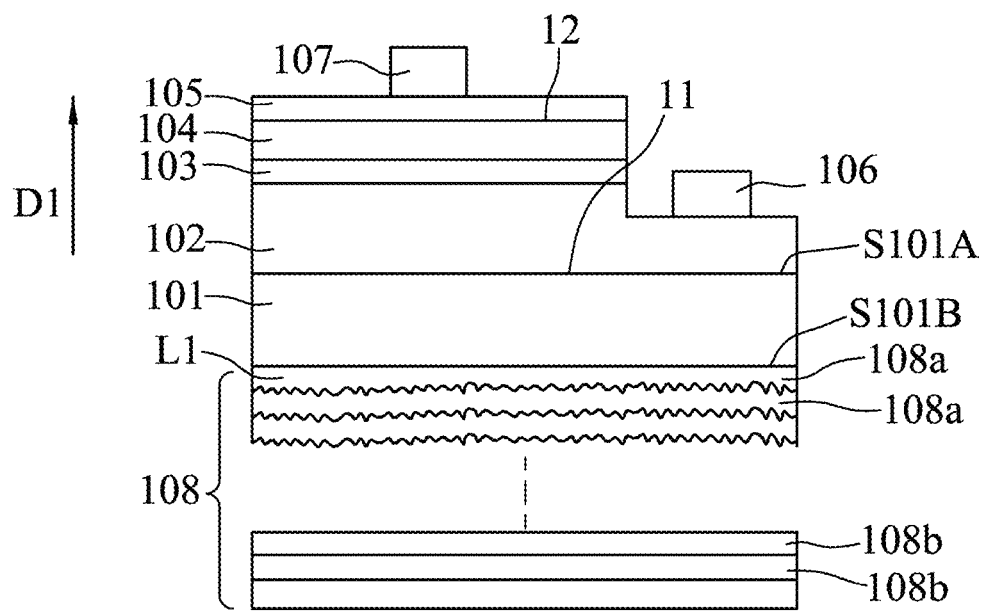
FIG. 2 is a schematic view of a first embodiment of a light-emitting diode according to the disclosure.

Referring to FIG. 2, a first embodiment of a light-emitting diode according to the present disclosure includes a semiconductor substrate 101, a semiconductor light-emitting stack, a transparent conducting layer 105, a first electrode 106, a second electrode 107, and a distributed Bragg reflector (DBR) structure 108.

The semiconductor substrate 101 is a growth substrate used for growing the semiconductor light-emitting stack, and is disposed between the semiconductor light-emitting stack and the DBR structure 108. The semiconductor substrate 101 may be made of an insulating material, which may include, but not limited to, sapphire ($Al_2O_3$) and spinel ($MgAl_2O_4$).

Alternatively, the semiconductor substrate 101 may be made of a conductive material. In some embodiments, the semiconductor substrate 101 may be made of silicon carbide (SiC), zinc sulfide (ZnS), zinc oxide (ZnO), silicon (Si), gallium arsenide (GaAs), diamond, and an oxide material (e.g., lithium niobate ($LiNbO_3$) or niobium galliate ($NdGaO_3$)) that is lattice matched to a nitride semiconductor. The semiconductor substrate 101 includes a first surface S101A and a second surface S101B opposite to each other. In some embodiments, the semiconductor substrate 101 may include a plurality of protrusions (not shown) formed on at least a portion of the first surface S101A. In such case, the protrusions of the semiconductor substrate 101 may be formed in a regular pattern, an irregular pattern, or a combination thereof. In this embodiment, the semiconductor substrate 101 is a patterned sapphire substrate.

The semiconductor substrate 101 may have a thickness ranging from 40 μm to 300 μm, such as from 80 μm to 300 μm, from 40 μm to 80 μm, and from 40 μm to 60 μm. In alternative embodiments, the light-emitting diode may optionally include the semiconductor substrate 101. For example, the semiconductor substrate 101 can be removed by physical etching or chemical etching, such that the light-emitting diode is formed as a thin film structure.

The semiconductor light-emitting stack is disposed on the semiconductor substrate 101, and has a first surface 11 and a second surface 12 opposite to each other. The semiconductor light-emitting stack includes, in sequence in a first direction (D1) from the first surface 11 to the second surface 12, a first conductivity type semiconductor layer 102, a light-emitting layer 103 and a second conductivity type semiconductor layer 104. The semiconductor light-emitting stack may be formed by metal-organic chemical vapor deposition (MOCVD) or other suitable deposition techniques. The semiconductor light-emitting stack may be made of a semiconductor material that can emit ultraviolet (UV) light radiation, blue light radiation, green light radiation, yellow light radiation, red light radiation, infrared light radiation, or the like, or combinations thereof. In some embodiments, the semiconductor light-emitting stack may be made of a nitride that can emit a light having a wavelength ranging from 200 nm to 950 nm. In some embodiments, the semiconductor light-emitting stack may be made of a gallium nitride-based material that is usually doped with a dopant, such as aluminum (Al), indium (In) or other suitable elements, and that can mainly emit a light radiation having a wavelength ranging from 200 nm to 550 nm. In alternative embodiments, the semiconductor light-emitting stack may be made of an aluminum gallium indium phosphide-based material or an aluminum gallium arsenide-based material that can mainly emit a light radiation having a wavelength ranging from 550 nm to 950 nm. In this embodiment, the semiconductor light-emitting stack mainly includes the first conductivity type semiconductor layer 102, the second conductivity type semiconductor layer 104, and the light-emitting layer 103 disposed between the first conductivity type semiconductor layer 102 and the second conductivity type semiconductor layer 104.

The first conductivity type semiconductor layer 102 may be made of a Group III to V compound semiconductor, a Group II to VI compound semiconductor, or a combination thereof. The first conductivity type semiconductor layer 102 may be doped with a first dopant. The first conductivity type semiconductor layer 102 may be made of a semiconductor material represented by $In_{X1}Al_{Y1}Ga_{1-X1-Y1}N$, wherein $0 \leq X1 \leq 1$, $0 \leq Y1 \leq 1$, and $0 \leq X1+Y1 \leq 1$, such as gallium nitride (GaN), aluminum gallium nitride (AlGaN), indium gallium nitride (InGaN), indium aluminum gallium nitride (InAlGaN); or alternatively, may be made of aluminum gallium arsenide (AlGaAs), gallium phosphide (GaP), gallium arsenide (GaAs), gallium arsenide phosphide (GaAsP), aluminum gallium indium phosphide (AlGaInP), or combinations thereof. The first dopant may be an n-type dopant, which may include, but not limited to, silicon (Si), germanium (Ge), tin (Sn), selenium (Se), and tellurium (Te). The first conductivity type semiconductor layer 102 is an n-type semiconductor layer when doped with the n-type dopant. In this embodiment, the first conductivity type semiconductor layer 102 is the n-type semiconductor layer doped with the n-type dopant.

The light-emitting layer 103 is disposed between the first conductivity type semiconductor layer 102 and the second conductivity type semiconductor layer 104. The light-emitting layer 103 serves as an area for recombining electrons and holes, so as to emit a light radiation. The material of the light-emitting layer 103 may be selected according to different emission wavelengths. The light-emitting layer 103 may be formed with a single quantum well structure or a multiple quantum well structure. The light-emitting layer 103 may include a well layer and a barrier layer, in which the barrier layer has a bandgap larger than that of the well layer. The light-emitting layer 103 can emit a light having different wavelengths by adjusting a composition ratio of the semiconductor materials thereof.

The second conductivity type semiconductor layer 104 is disposed on the light-emitting layer 103 opposite to the first conductivity type semiconductor layer 102. The second conductivity type semiconductor layer 104 may be made of a Group III to V compound semiconductor, a Group II to VI compound semiconductor, or a combination thereof. The second conductivity type semiconductor layer 104 may be made of a semiconductor material represented by $In_{X2}Al_{Y2}Ga_{1-X2-Y2}N$, wherein $0 \leq X2 \leq 1$, $0 \leq Y2 \leq 1$, and $0 \leq X2+Y2 \leq 1$; or alternatively, may be made of AlGaAs, GaP, GaAs, GaAsP, AlGaInP, or combinations thereof. The second conductivity type semiconductor layer 104 may be doped with a second dopant. The second dopant may be a p-type dopant, which may include, but not limited to, magnesium (Mg), zinc (Zn), calcium (Ca), strontium (Sr), and barium (Ba). The second conductivity type semiconductor layer 104 is a p-type semiconductor layer when doped with a p-type dopant. In this embodiment, the second conductivity type semiconductor layer 104 is the p-type semiconductor layer doped with the p-type dopant.

In order to dispose the first electrode 106 and the second electrode 107 on a same side of the first conductivity type semiconductor layer 102 and the second conductivity type semiconductor layer 104, the second conductivity type semiconductor layer 104 may be disposed on the first conductivity type semiconductor layer 102 to expose a portion of the first conductivity type semiconductor layer 102, or alternatively, the first conductivity type semiconductor layer 102 may be disposed on the second conductivity type semiconductor layer 104 to expose a portion of the second conductivity type semiconductor layer 104.

In this embodiment, the semiconductor light-emitting stack is formed by depositing the light-emitting layer 103 and the second conductivity type semiconductor layer 104 (i.e., p-type semiconductor layer) sequentially on the first conductivity type semiconductor layer 102 (i.e., n-type semiconductor layer). In addition, portions of the second conductivity type semiconductor layer 104 and the light-emitting layer 103 are removed, so as to expose a portion of the first conductivity type semiconductor layer 102. In some embodiments, the semiconductor light-emitting stack may further include at least one through hole (not shown) partially penetrating the light-emitting layer 103 and the second conductivity type semiconductor layer 104 to expose the first conductivity type semiconductor layer 102. That is, the first conductivity type semiconductor layer 102 is exposed through the at least one through hole. In such case, the through hole is defined by the light-emitting layer 103 and the second conductivity type semiconductor layer 104. In alternative embodiments, the semiconductor light-emitting stack may further include at least one platform (not shown), which may include the light-emitting layer 103, the second conductivity type semiconductor layer 104, or a combination thereof, and which may be located on a portion of the first conductivity type semiconductor layer 102.

In order to form an electrical connection between the second electrode 107 and the second conductivity type semiconductor layer 104, the transparent conducting layer 105 is disposed on the second conductivity type semiconductor layer 104 opposite to the light-emitting layer 103. The transparent conducting layer 105 may be formed as an ohmic contact to the second conductivity type semiconductor layer 104. The transparent conducting layer 105 may include, but not limited to, a light-transmissive conducting oxide (e.g., indium tin oxide (ITO), zinc oxide (ZnO), indium tin zinc oxide, indium zinc oxide, zinc tin oxide, gallium indium tin oxide, indium gallium oxide, gallium zinc oxide, aluminum-doped zinc oxide, and fluorine-doped tin oxide), a light-transmissive metal (e.g., nickel and gold), and a combination thereof. The light-transmissive conducting oxide may be doped with a dopant. In particular, the transparent conducting layer 105, which includes the light-transmissive conducting oxide, may have a better ohmic contact to the second conductivity type semiconductor layer 104. For example, a contact resistance of the light-transmissive conducting oxide (e.g., ITO and ZnO) to the second conductivity type semiconductor layer 104 is lower than that of a metal electrode to the second conductivity type semiconductor layer 104. Therefore, a forward voltage ($V_f$) of the light-emitting diode can be decreased by using the transparent conducting layer 105 including the light-transmissive conducting oxide, thereby increasing the luminous efficiency of the light-emitting diode. In addition, compared with the metal electrode, the light-transmissive conducting oxide is not easily stripped from a nitride semiconductor layer, and therefore, the light-emitting diode may have a higher reliability due to use of the transparent conducting layer 105 including the light-transmissive conducting oxide. In this embodiment, the transparent conducting layer 105 includes ITO, and is formed as an ohmic contact to the second conductivity type semiconductor layer 104.

In order to supply current to the first conductivity type semiconductor layer 102 and the second conductivity type semiconductor layer 104, respectively, the first electrode 106 is electrically connected to the first conductivity type semiconductor layer 102, directly or indirectly, and the second electrode 107 is electrically connected to the second conductivity type semiconductor layer 104, directly or indirectly. When the first conductivity type semiconductor layer 102 is the n-type semiconductor layer, the first electrode 106 is an n-type electrode.

When the first conductivity type semiconductor layer 102 is the p-type semiconductor layer, the first electrode 106 is a p-type electrode. The second electrode 107 may have a conductivity type opposite to that of the first electrode 106. In this embodiment, the first electrode 106 is the n-type electrode, and the second electrode 107 is the p-type electrode.

The second electrode 107 is in contact with the transparent conducting layer 105, to permit the second electrode 107 to be electrically connected to the second conductivity type semiconductor layer 104.

Each of the first electrode 106 and the second electrode 107 is a pad electrode, which is electrically connected to an external electrode or an external terminal to thereby supply current to the light-emitting diode. The first electrode 106 and the second electrode 107 may be respectively disposed at two opposite sides of the semiconductor light-emitting stack. A shape of each of the first electrode 106 and the second electrode 107 can be properly adjusted according to a size of the light-emitting diode and arrangement of the first electrode 106 and the second electrode 107, and the shape may be circle or regular polygon. In some embodiments, each of the first electrode 106 and the second electrode 107 may have a circle shape or a shape close to circle for wire bonding. In addition, a size of the pad electrode for each of the first electrode 106 and the second electrode 107 can be properly adjusted according to the size of the light-emitting diode and the arrangement of the first electrode 106 and the second electrode 107. In some embodiments, the pad electrode may have a circle shape and may have a diameter ranging from 30 µm to 150 µm. The shape and size of the pad electrode for the first electrode 106 may be the same as or different from the shape and size of the pad electrode for the second electrode 107.

The DBR structure 108 is usually disposed on the second surface S101B of the semiconductor substrate 101 opposite to the semiconductor light-emitting stack, so as to reflect a portion of light emitted from the light-emitting layer 103 and transmitted through the second surface S101B of the semiconductor substrate 101 to a light-emitting surface of the light-emitting diode, thereby increasing the amount of the emitted light and the luminous efficiency of the light-emitting diode. The DBR structure 108 includes at least one set of first light-transmitting layers 108a and at least one set of second light-transmitting layers 108b stacked on each other in the first direction (D1). The number of the first light-transmitting layers 108a in each set of the first light-transmitting layers 108a, and the number of the second light-transmitting layers 108b in each set of the second light-transmitting layers 108b may independently range from 2 to 6. A total set number of the first light-transmitting layers 108a and the second light-transmitting layers 108b may range from 2 to 50, such as from 10 to 50, or from 30 to 40. In this embodiment, the number of the first light-transmitting layers 108a in each set of the first light-transmitting layers 108a and the number of the second light-transmitting layers 108b in each set of the second light-transmitting layers 108b independently are 2, and the first light-transmitting layers 108a and the second light-transmitting layers 108b in the DBR structure 108 are alternately stacked. The DBR structure 108 may include plural sets of the first light-transmitting layers 108a which are stacked continuously in the first direction (D1), and plural sets of the second light-transmitting layers 108b disposed on the plural sets of the first light-transmitting layers 108a opposite to the semiconductor light-emitting stack. In some embodiments, the plural sets of the first light-transmitting layers 108a are stacked on the first surface 11 of the semiconductor light-emitting stack. At least two of the first light-transmitting layers 108a have different refractive indices, and at least two of the second light-transmitting layers 108b have different refractive indices. As described above, in this embodiment, the number of the first light-transmitting layers 108a in each set of the first light-transmitting layers 108a and the number of the second light-transmitting layers 108b in each set of the second light-transmitting layers 108b independently are 2. In each set of the first light-transmitting layers 108a, one of the first light-transmitting layers 108a is disposed proximate to the semiconductor substrate 101 and has a first refractive index (n1), and the other of the first light-transmitting layers 108a is disposed distal from the semiconductor substrate 101 and has a second refractive index (n2) greater than the first refractive index (n1). Similarly, in each set of the second light-transmitting layers 108b, one of the second light-transmitting layers 108b is disposed proximate to the semiconductor substrate 101 and has the first refractive index (n1), and the other of the second light-transmitting layers 108b is disposed distal from the semiconductor substrate 101 and has the second refractive index (n2) greater than the first refractive index (n1).

Examples of a material for making each of the first and second light-transmitting layers 108a, 108b may include, but not limited to, silicon oxide ($SiO_2$), silicon oxynitride ($SiON_x$), silicon nitride ($SiN_x$), aluminum oxide ($Al_2O_3$), magnesium fluoride ($MgF_2$), titanium oxide (TiO), titanium dioxide ($TiO_2$), trititanium pentoxide ($Ti_3O_5$), titanium (III) oxide ($Ti_2O_3$), tantalum pentoxide ($Ta_2O_5$), zirconia ($ZrO_2$), and combinations thereof.

In some embodiments, an outermost light-transmitting layer L1 of the DBR structure 108 proximate to the semiconductor light-emitting stack may have a thickness greater than those of remaining layers of the DBR structure 108. In addition, the outermost light-transmitting layer L1 may have a refractive index lower than those of remaining layers of the DBR structure 108, so as to increase a reflection effect of light emitted from the light-emitting layer 103.

In order to reduce total reflection within the DBR structure 108, the first light-transmitting layers 108a may have roughened interfaces, or alternatively, the second light-transmitting layers 108b may have roughened interfaces. In this embodiment, the first light-transmitting layers 108a have interface roughness greater than that of the second light-transmitting layers 108b. The set number of the first light-transmitting layers 108a may range from 1 to 45, such as more than 5. In some embodiments, the interface roughness of the first light-transmitting layers 108a may be one to three times the roughness of the second surface S101B of the semiconductor substrate 101. In some embodiments, the roughness of the second surface S101B of the semiconductor substrate 101 may range from 1.0 nm to 3.0 nm. In some embodiments, the interface roughness of the first light-transmitting layers 108a may range from 1.0 nm to 9.0 nm, such as from 1.5 nm to 5.0 nm.

Figure 3A:
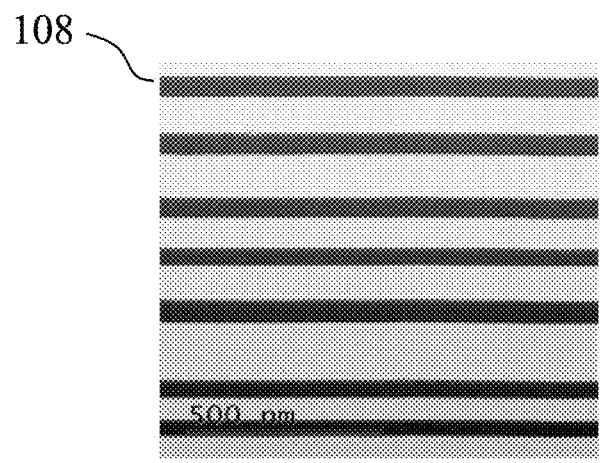
FIGS. 3a and 3b are transmission electron microscope (TEM) images respectively illustrating a distributed Bragg reflector (DBR) structure without a roughened interface, and a DBR structure with roughened interfaces.
Figure 3B:
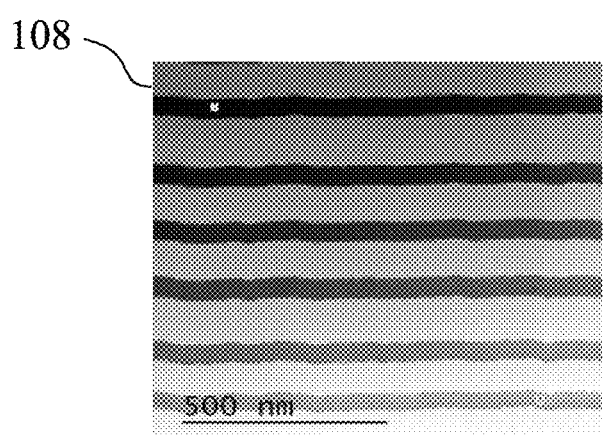
Figure 4A:
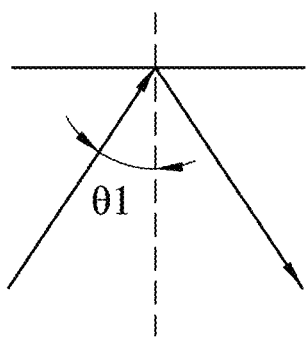
FIGS. 4a and 4b are schematic views respectively illustrating an optical path of a light transmitting to an interface of the DBR structure of FIG. 3a, and an optical path of a light transmitting to an interface of the DBR structure of FIG. 3b.
Figure 4B:
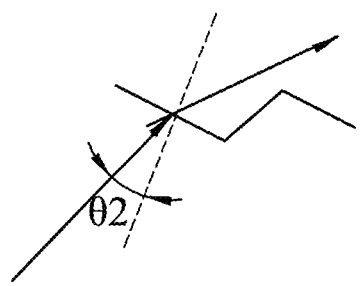

In this embodiment, the DBR structure 108 may be formed by ion beam deposition. In addition, the interface between the first light-transmitting layers 108a or between the second light-transmitting layers 108b can be roughened by adjusting voltage and gas parameters of ion source, deposition rate, power, vacuum, temperature, and carrier speed during the ion beam deposition. FIGS. 3a and 3b illustrate a TEM image of a DBR structure that is free from roughened interface (i.e., with a flat interface), and a TEM image of a DBR structure with roughened interfaces, respectively. It can be seen that interface roughness of the DBR structure shown in FIG. 3b is greater than that of the DBR structure shown in FIG. 3a. FIG. 4a illustrates an optical path of a light transmitted to the flat interface of the DBR structure of FIG. 3a, in which an incident angle (θ1) of the light is not smaller than a critical angle, resulting in total reflection of the light. FIG. 4b illustrates an optical path of a light transmitted to the roughened interface of the DBR structure of FIG. 3b, in which the incident angle (θ2) of the light is decreased due to the roughened interface of the DBR structure, which can reduce total reflection of the light and increase light transmission. Therefore, with the provision that the first light-transmitting layers 108a having interface roughness greater than that of the second light-transmitting layers 108b, the number of total reflection within the DBR structure 108 can be reduced, so as to increase the amount of the emitted light and the luminous efficiency of the light-emitting diode.

Figure 5A:
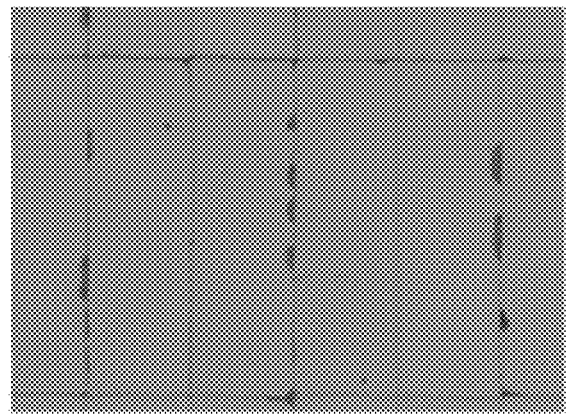
FIGS. 5a and 5b are schematic views respectively illustrating a back surface of a light-emitting diode obtained by splitting a wafer in which the DBR structure therein is free from any roughened interface, and a back surface of a light-emitting diode obtained by splitting a wafer in which the DBR structure therein has roughened interfaces.
Figure 5B:
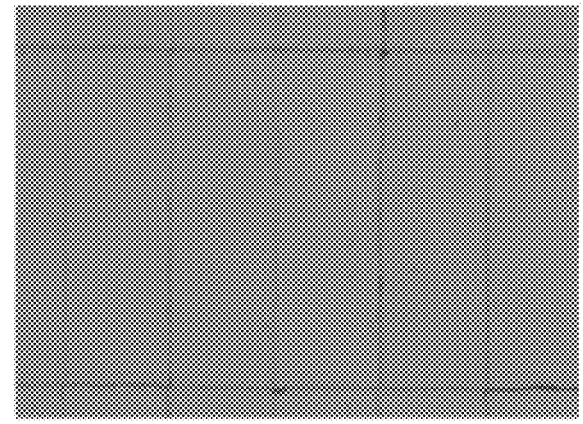

In addition, in the conventional light-emitting diode shown in FIG. 1, due to a poor adhesion among the layers of the DBR structure 908 and between the DBR structure 908 and the semiconductor substrate 901, the light-emitting diode might have a backside chipping during splitting. FIG. 5a is a schematic view illustrating a back surface of a light-emitting diode obtained by splitting a wafer, in which the DBR structure therein is free from any roughened interface. FIG. 5b is a schematic view illustrating a back surface of a light-emitting diode obtained by splitting a wafer, in which the DBR structure therein has roughened interfaces. It can be seen that a surface area of the DBR structure of the wafer having the roughened interfaces is increased, thereby increasing a contact area and an adhesion among the layers of the DBR structure, preventing backside chipping, and enhancing production yield.

Figure 6:
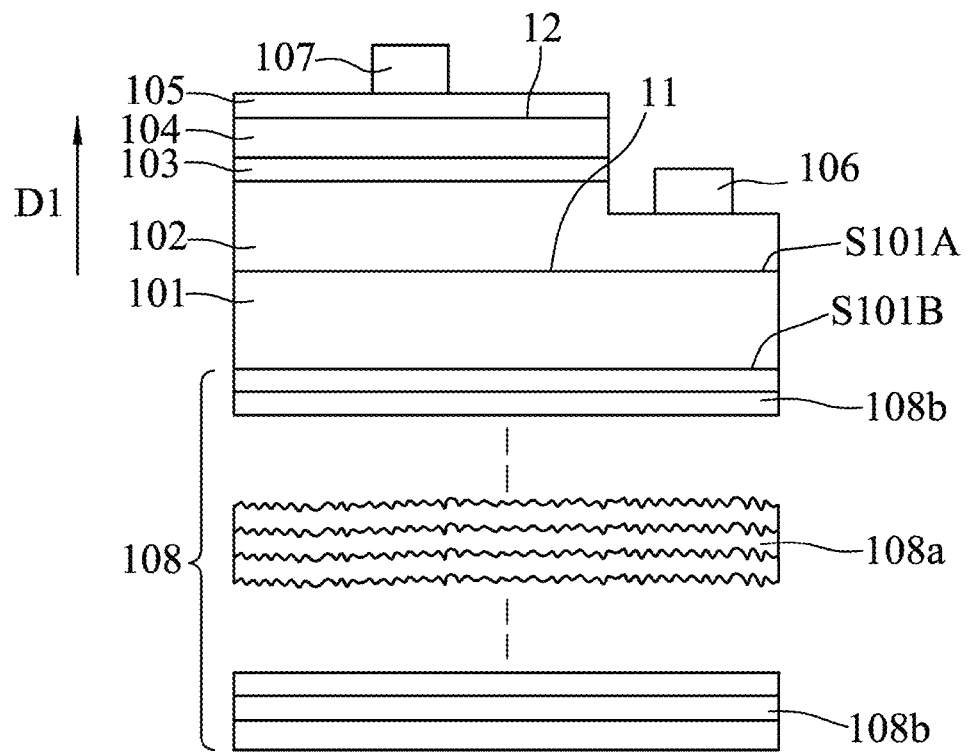
FIG. 6 is a schematic view of a second embodiment of the light-emitting diode according to the disclosure.

Referring to FIG. 6, a second embodiment of the light-emitting diode according to the present disclosure is generally similar to the first embodiment of the light-emitting diode, except that in the second embodiment, the DBR structure 108 includes plural sets of the second light-transmitting layers 108b, and at least one of the plural sets of the second light-transmitting layers 108b is spaced apart from remaining of the plural sets of the second light-transmitting layers 108b by the plural sets of the first light-transmitting layers 108a.

Figure 7:
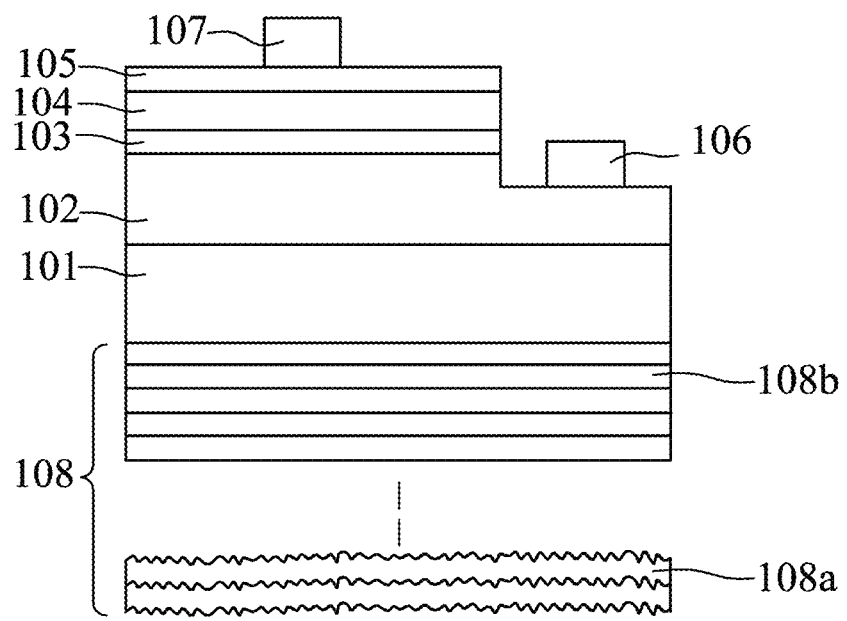
FIG. 7 is a schematic view of a third embodiment of the light-emitting diode according to the disclosure.

Referring to FIG. 7, a third embodiment of the light-emitting diode according to the present disclosure is generally similar to the first embodiment of the light-emitting diode, except that in the third embodiment, the DBR structure 108 includes plural sets of the first light-transmitting layers 108a disposed on the plural sets of the second light-transmitting layers 108b opposite to the semiconductor light-emitting stack. In this embodiment, because the first light-transmitting layers 108a have roughened interfaces, an adhesion between the light-emitting diode and a die-bonding paste can be increased during packaging, resulting in an increased packaging yield of the light-emitting diode.

Figure 8:
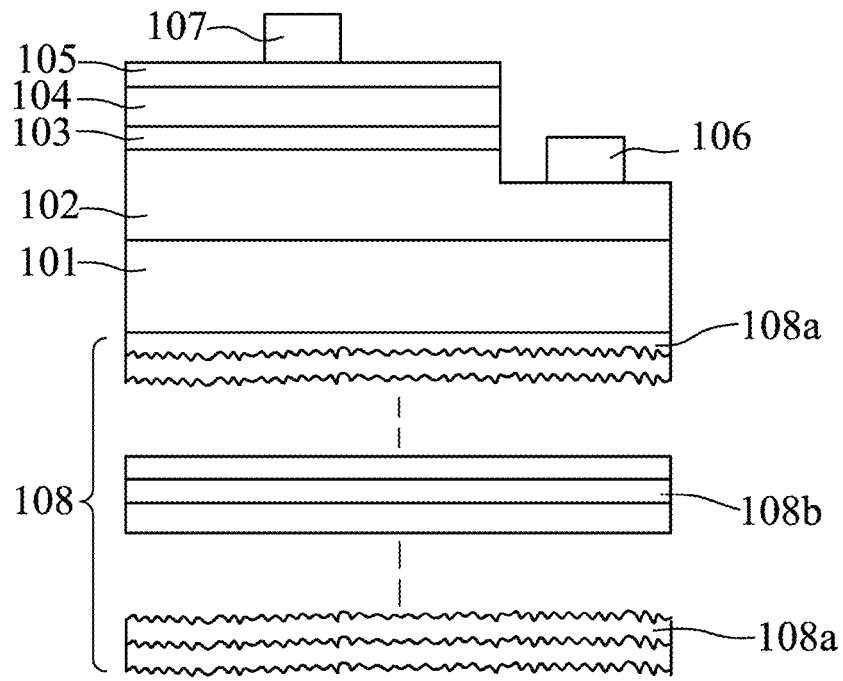
FIG. 8 is a schematic view of a fourth embodiment of the light-emitting diode according to the disclosure.

Referring to FIG. 8, a fourth embodiment of the light-emitting diode according to the present disclosure is generally similar to the first embodiment of the light-emitting diode, except that, in the fourth embodiment, the DBR structure 108 includes plural sets of the first light-transmitting layers 108a, and at least one of the plural sets of the first light-transmitting layers 108a is spaced apart from remaining of the plural sets of the first light-transmitting layers 108a by the at least one set of the second light-transmitting layers 108b in the first direction (D1).

Figure 9:
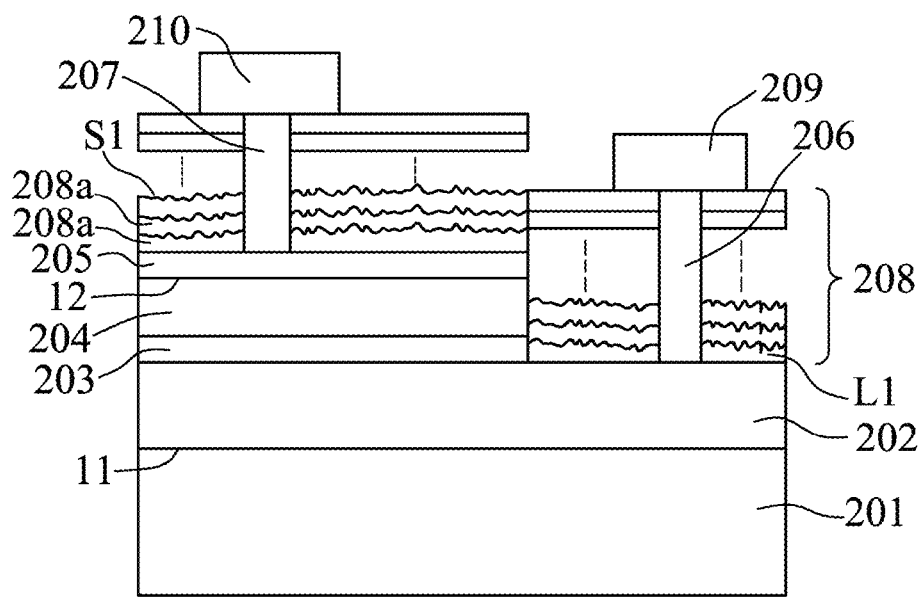
FIG. 9 is a schematic view of a fifth embodiment of the light-emitting diode according to the disclosure.

Referring to FIG. 9, a fifth embodiment of the light-emitting diode according to the present disclosure is generally similar to the first embodiment of the light-emitting diode, except for the following differences.

In this embodiment, the light-emitting diode is a flip-chip light-emitting diode, in which a light emitted from the light-emitting layer 203 is transmitted out of a transparent substrate 201. Specifically, the DBR structure 208 is disposed on the second surface 12 of the semiconductor light-emitting stack and includes two recesses. The transparent substrate 201 is disposed on the first surface 11 of the semiconductor light-emitting stack. The main light-emitting surface of the light-emitting diode is located on a side of the transparent substrate 201. The DBR structure 208 is mainly used to reflect light emitted from the light-emitting layer 203 to the transparent substrate 201, and the reflected light is transmitted out of the transparent substrate 201. Each of the first and second electrodes 206, 207 is made of a metallic material, and is filled in a respective one of the recesses of the DBR structure 208, so as to permit the first and second electrodes 206, 207 to be electrically connected to the first conductivity type semiconductor layer 202 and the second conductivity type semiconductor layer 204, respectively. A side of the DBR structure 108 opposite to the semiconductor light-emitting stack may further include a first bonding pad 209 and a second bonding pad 210, which are electrically connected to the first electrode 206 and the second electrode 207, respectively.

The transparent conducting layer 205 is disposed between the DBR structure 208 and the semiconductor light-emitting stack. The interface roughness of the first light-transmitting layers 208a may be 1.02 to 3 times the roughness of a surface of the transparent conducting layer 205 opposite to the semiconductor light-emitting stack. In some embodiments, the roughness of the surface of the transparent conducting layer 205 opposite to the semiconductor light-emitting stack may range from 0.2 nm to 5 nm. In some embodiments, the interface roughness of the first light-transmitting layers 208a may range from 0.2 nm to 15 nm.

Figure 10A:
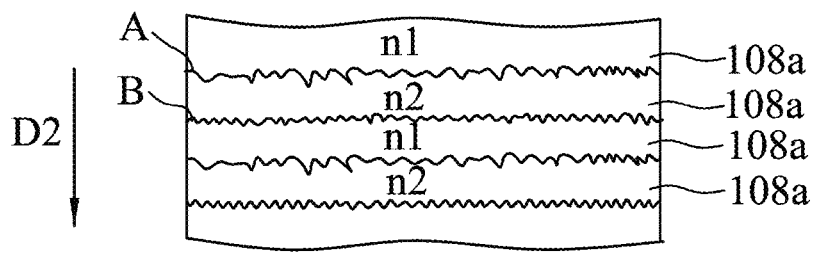
FIG. 10a is a schematic view illustrating a DBR structure of a sixth embodiment of the light-emitting diode according to the disclosure.

Referring to FIG. 10a, a sixth embodiment of the light-emitting diode according to the present disclosure is generally similar to the first embodiment of the light-emitting diode, except that, in the sixth embodiment, the first light-transmitting layers 108a in each set of the first light-transmitting layers 108a have refractive indices that increase along a second direction (D2) away from said semiconductor light-emitting stack.

Specifically, as shown in FIG. 10a, in each set of the first light-transmitting layers 108a, one of the first light-transmitting layers 108a is disposed proximate to the semiconductor light-emitting stack and has a first refractive index (n1), and the other of the first light-transmitting layers 108a is disposed distal from the semiconductor light-emitting stack and has a second refractive index (n2) greater than the first refractive index (n1).

Two adjacent sets of the at least one set of the first light-transmitting layers 108a has interface roughness at an interface (B) that is less than interface roughness at an interface (A) of the first light-transmitting layers 108a in each set of the first light-transmitting layers 108a. The interface roughness at the interface (A) of the first light-transmitting layers 108a in each set of the first light-transmitting layers 108a may range from 1.0 nm to 20.0 nm, such as from 1.5 nm to 10 nm.

Figure 10B:
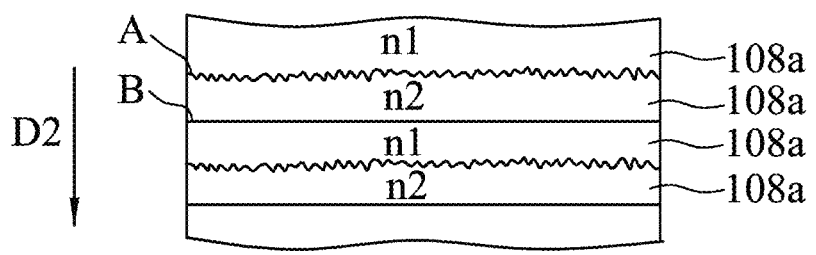
FIG. 10b is a schematic view illustrating a variation of the sixth embodiment of the light-emitting diode according to the disclosure.

In a variation of the sixth embodiment, as shown in FIG. 10b, the interface (B) is flat. By having the interface (B) which is smoother and which can increase total reflection of light, and the interface (A) which is coarser and which can prevent light absorbance or light decay caused by at least two total reflection of light, the luminous efficiency of the light-emitting diode can be enhanced when a light emitted from the light-emitting layer 103 is transmitted to the DBR structure 108.

Figure 11:
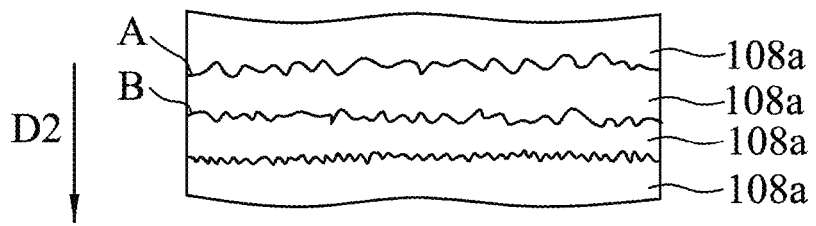
FIG. 11 is a schematic view illustrating a DBR structure of a seventh embodiment of the light-emitting diode according to the disclosure.

Referring to FIG. 11, a seventh embodiment of the light-emitting diode according to the present disclosure is generally similar to the first embodiment of the light-emitting diode, except that, in the seventh embodiment, the interface roughness of the first light-transmitting layers 108a decreases in the second direction (D2) away from the semiconductor light-emitting stack. In this embodiment, the interface roughness of the second light-transmitting layers 108b may decrease or may be the same in the second direction (D2) away from the semiconductor light-emitting stack. In addition, a side of the DBR structure 108 proximate to the semiconductor substrate 101 may have a large roughness, which can increase a contact surface area between the semiconductor substrate 101 and the DBR structure 108, improve an adhesion of the DBR structure 108 to the semiconductor substrate 101, prevent backside chipping, and enhance production yield.

Figure 12A:
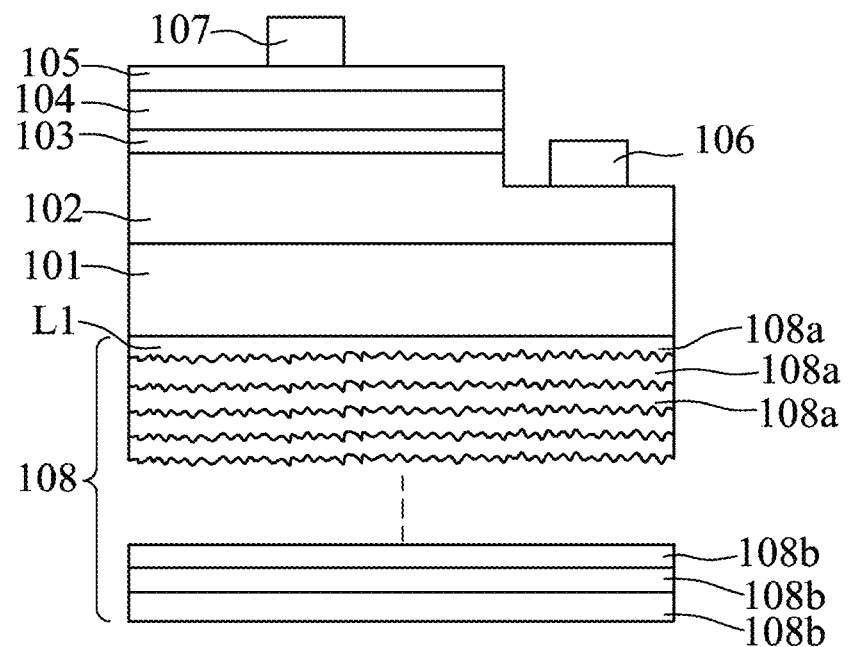
FIG. 12a is a schematic view of an eighth embodiment of the light-emitting diode according to the disclosure.
Figure 12B:
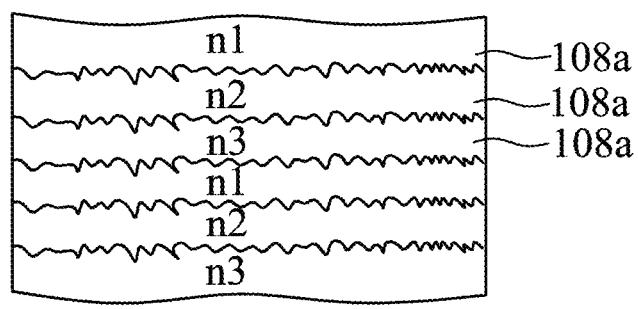
FIG. 12b is a schematic view illustrating a DBR structure of the eighth embodiment of the light-emitting diode according to the disclosure.

Referring to FIGS. 12a and 12b, an eighth embodiment of the light-emitting diode according to the present disclosure is generally similar to the first embodiment of the light-emitting diode, except that, in the eighth embodiment, the number of the first light-transmitting layers 108a in each set of the first light-transmitting layers 108a, and the number of the second light-transmitting layers 108b in each set of the second light-transmitting layers 108b are independently 3. Specifically, three first light-transmitting layers 108a in each set of the first light-transmitting layers 108a has a first refractive index (n1), a second refractive index (n2), and a third refractive index (n3), respectively. The first light-transmitting layer 108a having the first refractive index (n1) is disposed proximate to the semiconductor light-emitting stack, the first light-transmitting layer 108a having the third refractive index (n3) is disposed distal from the semiconductor light-emitting stack, and the first light-transmitting layer 108a having the second refractive index (n2) is disposed therebetween. The third refractive index (n3) is greater than the second refractive index (n2), and the second refractive index (n2) is greater than the first refractive index (n1). It is noted that there are no particular limitations on the number of the first light-transmitting layers 108a in each set of the first light-transmitting layers 108a, and the number of the second light-transmitting layers 108b in each set of the second light-transmitting layers 108b.

Figure 13:
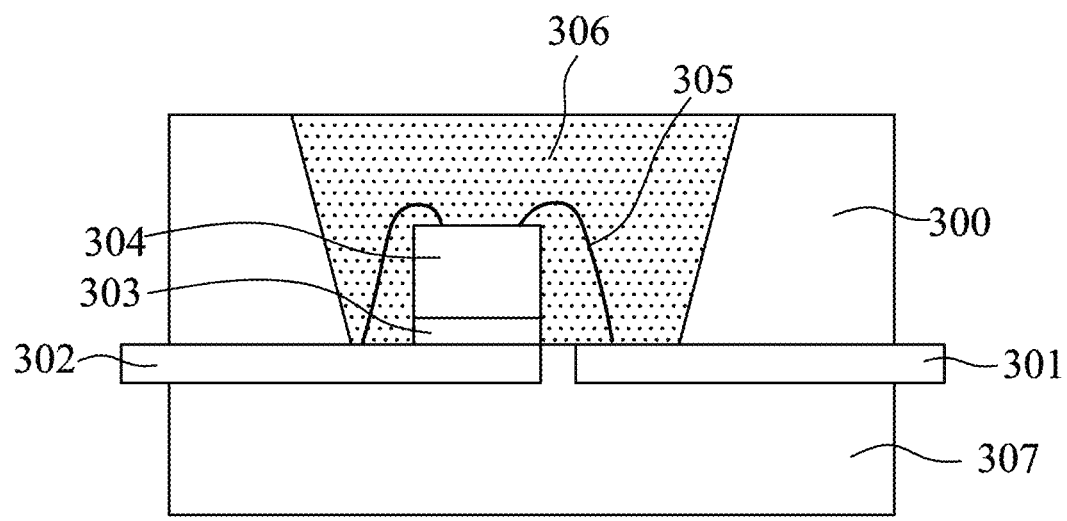
FIG. 13 is a schematic view of an embodiment of a light-emitting diode packaging structure according to the disclosure.

FIG. 13 shows a light-emitting diode packaging structure that includes a mounting substrate 307 and the light-emitting diode of this disclosure. Such light-emitting diode packaging structure can be widely used in a display or a backlight, which can meet a high brightness requirement of backlight products.

Specifically, the light-emitting diode packaging structure includes a lead frame 300, a light-emitting diode 304, wires 305, an encapsulant 306, and the mounting substrate 307. The lead frame 300 may be made of a plastic material or a ceramic material. The lead frame includes a first electrode 301 and a second electrode 302. The light-emitting diode 304 is the light-emitting diode of the first embodiment. The light-emitting diode 304 is mounted on the second electrode 302 through a die-bonding paste 303, and includes first and second electrodes (not shown). The first and second electrodes of the light-emitting diode 304 are electrically connected to the first and second electrodes 301, 302 of the lead frame 300, respectively, through the wires 305. The light-emitting diode packaging structure may emit a blue light (e.g., a light having an emission wavelength of 450 nm), or a mixed light (e.g., a combination of a blue light and a white light). The encapsulant 306 is light-transmissive, and is used to protect the light-emitting diode 304. In order to emit a white light, the light-emitting diode packaging structure may further include a wavelength conversion layer disposed in the encapsulant 306. The encapsulant 306 can cover at least one side of the light-emitting diode 304 by, for example, but not limited to, dispensing, coating, or a combination thereof. The wavelength conversion layer may include a red phosphor, a green phosphor, a yellow phosphor or combinations thereof.

The present disclosure also provides a light-emitting diode module that includes a mounting substrate and an array of the light-emitting diodes of this disclosure (not shown). In addition, the present disclosure also provides a light-emitting device that includes a plurality of the light-emitting diodes of this disclosure which are connected together.

In the DBR structure, because the first light-transmitting layers have interface roughness greater than that of the second light-transmitting layers, the light-emitting diode of the present disclosure might have the following advantages:

1. Light emitted from the light-emitting layer can be efficiently reflected through the DBR structure, thereby reducing the number of total reflection of the light in the DBR structure, and enhancing the luminous efficiency of the light-emitting diode.
2. An adhesion among the layers of the DBR structure or between the semiconductor substrate and the DBR structure can be improved, so as to prevent backside chipping during splitting and ablation caused by a thrust force, thereby increasing the production yield of the light-emitting diode.

3. An adhesion between the light-emitting diode and the die-bonding paste can be improved to thereby improve packaging yield of the light-emitting diode.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode, comprising:
a semiconductor light-emitting stack having a first surface and a second surface opposite to each other, said semiconductor light-emitting stack including, in sequence in a first direction from said first surface to said second surface, a first conductivity type semiconductor layer, a light-emitting layer, and a second conductivity type semiconductor layer; and
a distributed Bragg reflector (DBR) structure disposed on one of said first surface and said second surface of said semiconductor light-emitting stack, and including at least one set of first light-transmitting layers and at least one set of second light-transmitting layers stacked on each other in the first direction, said first light-transmitting layers in said at least one set of first light-transmitting layers having interface roughness greater than that of said second light-transmitting layers in said at least one set of second light-transmitting layers, at least two of said first light-transmitting layers having different refractive indices, at least two of said second light-transmitting layers having different refractive indices.

2. The light-emitting diode of claim 1, wherein the number of said first light-transmitting layers in each set of said first light-transmitting layers and the number of said second light-transmitting layers in each set of said second light-transmitting layers independently range from 2 to 6.

3. The light-emitting diode of claim 1, wherein a total set number of said first light-transmitting layers and said second light-transmitting layers ranges from 2 to 50.

4. The light-emitting diode of claim 1, each of said first and second light-transmitting layers is independently made of a material selected from the group consisting of silicon oxide ($SiO_2$), silicon oxynitride (SiONx), silicon nitride (SiNx), aluminum oxide ($Al_2O_3$), magnesium fluoride ($MgF_2$), titanium oxide (TiO), titanium dioxide ($TiO_2$), trititanium pentoxide ($Ti_3O_5$), titanium (III) oxide ($Ti_2O_3$), tantalum pentoxide ($Ta_2O_5$), zirconia ($ZrO_2$), and combinations thereof.

5. The light-emitting diode of claim 1, wherein the set number of said first light-transmitting layers ranges from 1 to 45.

6. The light-emitting diode of claim 1, wherein said DBR structure includes plural sets of said first light-transmitting layers which are stacked continuously in the first direction.

7. The light-emitting diode of claim 1, wherein said DBR structure includes plural sets of said first light-transmitting layers, at least one of the plural sets of said first light-transmitting layers being spaced apart from remaining of the plural sets of said first light-transmitting layers by the at least one set of said second light-transmitting layers in the first direction.

8. The light-emitting diode of claim 6, wherein the plural sets of said first light-transmitting layers are stacked on said first surface of said semiconductor light-emitting stack.

9. The light-emitting diode of claim 6, wherein said DBR structure includes plural sets of said second light-transmitting layers, at least one of the plural sets of said second light-transmitting layers being spaced apart from remaining of the plural sets of said second light-transmitting layers by the plural sets of said first light-transmitting layers.

10. The light-emitting diode of claim 6, wherein said DBR structure includes plural sets of said second light-transmitting layers disposed on the plural sets of said first light-transmitting layers opposite to said semiconductor light-emitting stack.

11. The light-emitting diode of claim 1, further comprising a semiconductor substrate disposed between said semiconductor light-emitting stack and said DBR structure.

12. The light-emitting diode of claim 11, wherein said semiconductor substrate has a first surface and a second surface opposite to each other, said DBR structure being disposed on said second surface of said semiconductor substrate, the interface roughness of said first light-transmitting layers being one to three times the roughness of said second surface of said semiconductor substrate.

13. The light-emitting diode of claim 12, wherein the roughness of said second surface of said semiconductor substrate ranges from 1.0 nm to 3.0 nm.

14. The light-emitting diode of claim 13, wherein the interface roughness of said first light-transmitting layers ranges from 1.0 nm to 9.0 nm.

15. The light-emitting diode of claim 1, further comprising a transparent substrate disposed on the other of said first surface and said second surface of said semiconductor light-emitting stack.

16. The light-emitting diode of claim 1, wherein said first light-transmitting layers in each set of said first light-transmitting layers, and said second light-transmitting layers in each set of said second light-transmitting layers have refractive indices that increase along a second direction away from said semiconductor light-emitting stack.

17. The light-emitting diode of claim 1, wherein the interface roughness of said first light-transmitting layers and said second light-transmitting layers decreases in a second direction away from said semiconductor light-emitting stack.

18. A light-emitting diode, comprising:
a semiconductor light-emitting stack having a first surface and a second surface opposite to each other, said semiconductor light-emitting stack including, in sequence in a first direction from said first surface to said second surface, a first conductivity type semiconductor layer, a light-emitting layer, and a second conductivity type semiconductor layer; and a DBR structure disposed on one of said first surface and said second surface of said semiconductor light-emitting stack, and including at least one set of first light-transmitting layers and at least one set of second light-transmitting layers stacked on each other in the first direction, said first light-transmitting layers in said at least one set of first light-transmitting layers having interface roughness ranging from 1.0 nm to 20.0 nm, said first light-transmitting layers in each set of said first light-transmitting layers having refractive indices that increase along a second direction away from said semiconductor light-emitting stack.

19. The light-emitting diode of claim 18, wherein two adjacent sets of the at least one set of said first light-transmitting layers has interface roughness less than interface roughness of said first light-transmitting layers in each set of said first light-transmitting layers.

20. A light-emitting diode packaging structure, comprising a mounting substrate and the light-emitting diode as claimed in claim 1 disposed on said mounting substrate.

* * * * *